(12) United States Patent
Peng

(10) Patent No.: US 11,659,754 B2
(45) Date of Patent: May 23, 2023

(54) QUANTUM DOT INK WITH COLORED QUANTUM DOTS

(71) Applicant: SHENZHEN CHINA STAR OPTOELECTRONICS SEMICONDUCTOR DISPLAY TECHNOLOGY CO., LTD., Guangdong (CN)

(72) Inventor: Wenxiang Peng, Guangdong (CN)

(73) Assignee: SHENZHEN CHINA STAR OPTOELECTRONICS SHENZHEN CHINA SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 227 days.

(21) Appl. No.: 16/970,366

(22) PCT Filed: Jul. 9, 2020

(86) PCT No.: PCT/CN2020/101006
§ 371 (c)(1),
(2) Date: Aug. 16, 2020

(87) PCT Pub. No.: WO2021/243801
PCT Pub. Date: Dec. 9, 2021

(65) Prior Publication Data
US 2021/0384261 A1 Dec. 9, 2021

(30) Foreign Application Priority Data

Jun. 4, 2020 (CN) .......................... 202010500173.5

(51) Int. Cl.
*H10K 59/38* (2023.01)
*H01L 27/32* (2006.01)
(Continued)

(52) U.S. Cl.
CPC .......... *H01L 27/322* (2013.01); *H01L 27/156* (2013.01); *H01L 33/502* (2013.01);
(Continued)

(58) Field of Classification Search
CPC . H01L 27/322; H01L 33/502; H01L 51/5268; H01L 2933/0091
See application file for complete search history.

(56) References Cited

U.S. PATENT DOCUMENTS

2018/0122613 A1   5/2018  Sadasivan et al.
2019/0055465 A1*  2/2019  Park ....................... C08F 220/06
(Continued)

FOREIGN PATENT DOCUMENTS

CN   103155179 A   6/2013
CN   106009930 A   10/2016
(Continued)

*Primary Examiner* — Jay C Chang
*Assistant Examiner* — Mikka Liu
(74) *Attorney, Agent, or Firm* — The Roy Gross Law Firm, LLC; Roy Gross

(57) ABSTRACT

A quantum dot ink, a manufacturing method of a full-color film, and a display panel are provided. The quantum dot ink includes a plurality of quantum dots, a plurality of scattering particles, a polar solvent, and a transparent polymer material, wherein the transparent polymer material is used as a host material.

5 Claims, 2 Drawing Sheets

(51) Int. Cl.
  *H01L 51/52* (2006.01)
  *H01L 33/50* (2010.01)
  *H01L 33/58* (2010.01)
  *H01L 27/15* (2006.01)

(52) U.S. Cl.
  CPC .......... *H01L 33/58* (2013.01); *H01L 51/5268* (2013.01); *H01L 51/5284* (2013.01); *H01L 2933/0041* (2013.01); *H01L 2933/0058* (2013.01); *H01L 2933/0091* (2013.01)

(56) References Cited

U.S. PATENT DOCUMENTS

| | | | | |
|---|---|---|---|---|
| 2021/0202765 A1* | 7/2021 | Cho | ........................ | C09K 11/70 |
| 2021/0317326 A1* | 10/2021 | Doherty | ................ | G03F 7/0042 |
| 2022/0204800 A1* | 6/2022 | Pousthomis | ......... | C09K 11/661 |

FOREIGN PATENT DOCUMENTS

| | | |
|---|---|---|
| CN | 106526962 A | 3/2017 |
| CN | 107674500 A | 2/2018 |
| CN | 109370312 A | 2/2019 |
| CN | 109535836 A | 3/2019 |
| CN | 110459560 A | 11/2019 |
| CN | 111063708 A | 4/2020 |
| KR | 20180070991 A | 6/2018 |

\* cited by examiner

QUANTUM DOT INK WITH COLORED QUANTUM DOTS

FIELD OF INVENTION

The present application relates to the field of display technologies, and more particularly to a quantum dot ink, a manufacturing method of a full-color film, and a display panel.

BACKGROUND OF INVENTION

Quantum dot-light emitting diode (QD-LED) structure displays comprise two parts: a quantum dot light color conversion film and a light emitting diode. The QD-LED structure displays not only have characteristics of autonomous light emission, thinness, and flexibility of LED devices, but also have advantages of high color gamut of quantum dots. The structural devices utilize a photoluminescence characteristic of QD to convert blue light of a backlight into red light and green light, thereby achieving full-color display.

QD film layer can usually be made by inkjet printing (IJP) process. The technical advantage of IJP is that IJP can control position and volume of a quantum dot ink drop, so that the quantum dot ink drop can be printed into a film in a pixel-level area. Composition of a quantum dot ink has a greater impact on its brightness conversion rate and inkjet printing process requirements, and further development and optimization are still needed.

SUMMARY OF INVENTION

The present application provides a quantum dot ink, a manufacturing method of a full-color film, and a display panel, scattering particles in the quantum dot ink can be stably dispersed in the quantum dot ink to prevent an issue of equipment clogging during printing of the quantum dot ink due to uneven dispersion.

In order to solve the above issues, in a first aspect, the present invention provides a quantum dot ink. The quantum dot ink comprises quantum dots, scattering particles, a polar solvent, and a transparent polymer material as a host material.

In the quantum dot ink according to an embodiment of the present invention, the scattering particles are selected from at least one of silicon dioxide and titanium dioxide.

In the quantum dot ink according to an embodiment of the present invention, the polar solvent is selected from at least one of N,N-dimethylformamide, N,N-dimethylacetamide, tetramethylurea, dimethyl sulfoxide, trimethyl phosphate, and N-methylpyrrolidone.

In the quantum dot ink according to an embodiment of the present invention, the transparent polymer material is a transparent polymer that is soluble in the polar solvent.

In the quantum dot ink according to an embodiment of the present invention, in the quantum dot ink, a content of the quantum dots ranges between 20 wt % and 30 wt %, a content of the scattering particles ranges between 1 wt % and 10 wt %, a content of the polar solvent ranges between 20 wt % and 30 wt %, and a remainder is the transparent polymer material.

In the quantum dot ink according to an embodiment of the present invention, the host material comprises polyvinylidene fluoride.

In the quantum dot ink according to an embodiment of the present invention, the quantum dots are selected from one of red light quantum dots and green light quantum dots.

In another aspect, the present invention further provides a manufacturing method of a full-color film. The manufacturing method comprises the following steps: S10: mixing and dispersing scattering particles, a polar solvent, and a transparent polymer material uniformly to form a blank ink; S20: adding red quantum dots to the blank ink and dispersing the red quantum dots uniformly to form a red quantum dot ink, and adding green quantum dots to the blank ink and dispersing the green quantum dots uniformly to form a green quantum dot ink; S30: providing a substrate and forming a color filter layer on the substrate, wherein the color filter layer comprises a plurality of red color resists, a plurality of blue color resists, a plurality of green color resists, and a plurality of first black matrices formed between the plurality of red color resistors, a plurality of blue color resistors, and the plurality of green color resistors; S40: forming a buffer layer on the color filter layer; S50: forming a plurality of second black matrices corresponding to the plurality of first black matrices on the buffer layer; and S60: in gaps of the plurality of second black matrices, successively dripping the red quantum dot ink on a corresponding region of the plurality of red color resists, dripping the green quantum dot ink on a corresponding region of the plurality of green color resists, dripping the blank ink on a corresponding region of the plurality of blue color resists, and heating to remove the polar solvent to form a quantum dot color conversion layer.

In the manufacturing method of the full-color film according an embodiment of the present invention, in the step S10, the scattering particles are selected from at least one of silicon dioxide and titanium dioxide, the polar solvent is selected from at least one of N,N-dimethylformamide, N,N-dimethylacetamide, tetramethylurea, dimethyl sulfoxide, trimethyl phosphate, and N-methylpyrrolidone, and the transparent polymer material is a transparent polymer that is soluble in the polar solvent.

In the manufacturing method of the full-color film according an embodiment of the present invention, in the step S20, in the red quantum dot ink, a content of the red quantum dots ranges between 20 wt % and 30 wt %, and in the green quantum dot ink, a content of the green quantum dots ranges between 20 wt % and 30 wt %.

In the manufacturing method of the full-color film according an embodiment of the present invention, in the step S40, the buffer layer is a single layer of a silicon nitride film or a silicon oxide film, or a laminated film layer of the silicon nitride film and the silicon oxide film.

In the manufacturing method of the full-color film according an embodiment of the present invention, in the step S60, a dropping process of the red quantum dot ink, the green quantum dot ink, and the blank ink is an inkjet printing process.

In another aspect, the present invention provides a display panel. The display panel comprises an array driving layer, a blue light emitting layer, and the full-color film formed by the above manufacturing method of the full-color film.

In the display panel according to an embodiment of the present invention, the color filter layer is on the quantum dot color conversion layer along a light emitting direction of the display panel.

In the display panel according to an embodiment of the present invention, the array driving layer comprises a plurality of thin film transistors arranged in an array.

In the display panel according to an embodiment of the present invention, the blue light emitting layer is a blue organic light emitting diode (OLED) light emitting layer, a blue Mini LED backlight, or a blue Micro backlight.

Beneficial Effect

Compared with the prior art, the present invention provides a quantum dot ink, a manufacturing method of a full-color film, and a display panel. The quantum dot ink includes quantum dots, scattering particles, a polar solvent, and a transparent polymer material as a host material. On one hand, addition of scattering particles can effectively improve a brightness conversion rate of a film formed from the quantum dots. On another hand, use of the polar solvent for dissolution and dispersion allows the scattering particles to be stably dispersed in the quantum dot ink, preventing an issue of equipment clogging during printing of the quantum dot ink due to uneven dispersion.

DESCRIPTION OF DRAWINGS

In order to more clearly explain technical solutions in embodiments of the present application, drawings required in the description of the embodiments will be briefly introduced below. Obviously, the drawings in the following description are only some embodiments of the present application. For those skilled in the art, without paying any creative work, other drawings can also be obtained based on these drawings.

DETAILED DESCRIPTION OF PREFERRED EMBODIMENTS

Figure 1:
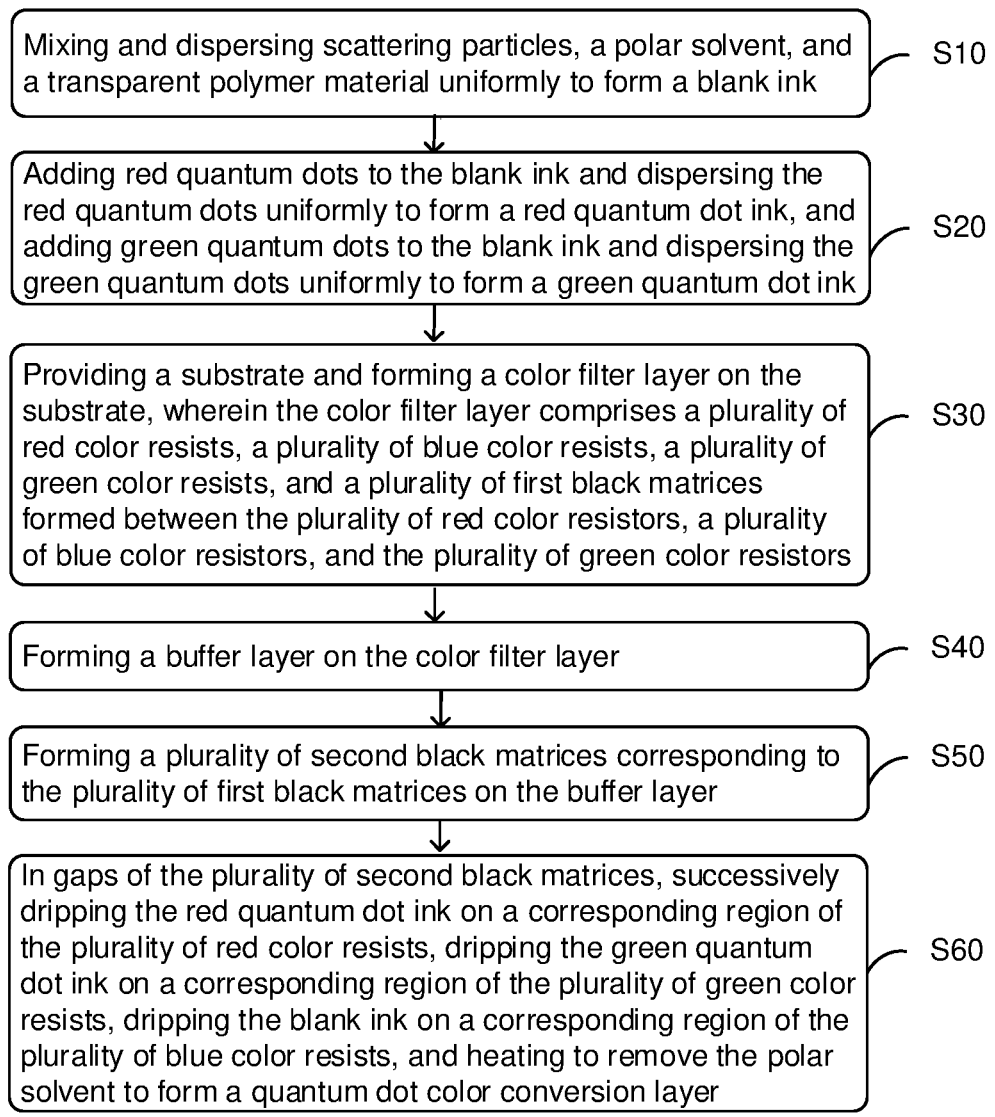
FIG. 1 is a schematic diagram of a text flow of a manufacturing method of a full-color film according to an embodiment of the present invention.

Technical solutions in embodiments of the present invention will be clearly and completely described below in conjunction with drawings in the embodiments of the present invention. Obviously, the described embodiments are only a part of the embodiments of the present invention, rather than all the embodiments. Based on the embodiments of the present invention, all other embodiments obtained by those skilled in the art without creative work shall fall within the protection scope of the present invention.

In the specification, it is to be understood that terms such as "central," "longitudinal," "lateral," "length," "width," "thickness," "upper," "lower," "front," "rear," "left," "right," "vertical," "horizontal," "top," "bottom," "inner," and "outer," should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance or to imply the number of indicated technical features. Thus, the feature defined with "first" and "second" may comprise one or more of the features. In the description of the present disclosure, "a plurality of" means two or more than two, unless specified otherwise.

The word "exemplary" is used herein to mean "serving as an example, instance, or illustration." Any embodiment described herein as "exemplary" is not necessarily to be construed as preferred or advantageous over other embodiments. The following description is presented to enable any person skilled in the art to make and use the invention. Details are set forth in the following description for purpose of explanation. It should be appreciated that one of ordinary skill in the art would realize that the invention may be practiced without the use of these specific details. In other instances, well known structures and processes are not elaborated in order not to obscure the description of the invention with unnecessary details. Thus, the present invention is not intended to be limited by the embodiments shown, but is to be accorded with the widest scope consistent with the principles and features disclosed herein.

An embodiment of the present invention provides a quantum dot ink. The quantum dot ink comprises quantum dots, scattering particles, a polar solvent, and a transparent polymer material as a host material.

The quantum dots are usually red light quantum dots and green light quantum dots, corresponding to red and green pixels in a display panel. The scattering particles are selected from at least one of silicon dioxide and titanium dioxide. The polar solvent is selected from at least one of N,N-dimethylformamide, N,N-dimethylacetamide, tetramethylurea, dimethyl sulfoxide, trimethyl phosphate, and N-methylpyrrolidone or other commonly used polar solvents. The transparent polymer material is a transparent polymer that is soluble in the polar solvent. For example, polyvinylidene fluoride can generally be included.

In an embodiment of the present invention, in the quantum dot ink, a content of the quantum dots ranges between 20 wt % and 30 wt %, a content of the scattering particles ranges between 1 wt % and 10 wt %, a content of the polar solvent ranges between 20 wt % and 30 wt %, and a remainder is the transparent polymer material. It is understood that, other ratios can also be used, so as to obtain a stably dispersed quantum dot ink.

In the quantum dot ink provided in the foregoing embodiments, by adding scattering particles, a brightness conversion rate of a film formed from the quantum dots can be effectively improved. However, because the scattering particles are usually polar particles such as silica or titanium dioxide, two-quantum dot ink is usually non-polar, which leads to unstable dispersion of the scattering particles in a system. This leads to an issue of clogging print nozzles when printing ink. By dispersing the scattering particles and quantum dots in a polar solvent, the scattering particles can be stably dispersed and the aforementioned issues can be avoided.

Another embodiment of the present invention also provides a manufacturing method of a full-color film. For steps, refer to FIG. 1 and FIG. 2A to FIG. 2C. Specifically, the manufacturing method includes the following steps:

S10: mixing and dispersing scattering particles, a polar solvent, and a transparent polymer material uniformly to form a blank ink.

S20: adding red quantum dots to the blank ink and dispersing the red quantum dots uniformly to form a red quantum dot ink, and adding green quantum dots to the blank ink and dispersing the green quantum dots uniformly to form a green quantum dot ink.

Figure 2A:
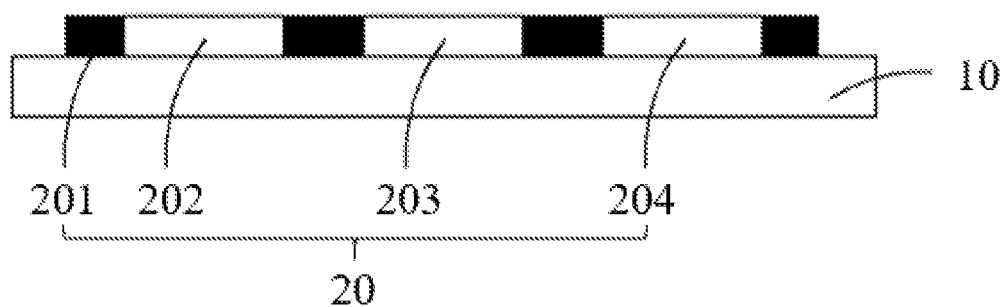
FIG. 2A to FIG. 2C are schematic structural diagrams of a manufacturing method of a full-color film according to an embodiment of the present invention.

S30: providing a substrate 10 and forming a color filter layer 20 on the substrate 10, wherein the color filter layer 20 comprises a plurality of red color resists 202, a plurality of green color resists 203, a plurality of blue color resists 204, and a plurality of first black matrices 201 formed between the plurality of red color resistors 202, a plurality of green color resistors 203, and the plurality of blue color resistors 204, which forms a structure shown in FIG. 2A.

Figure 2B:
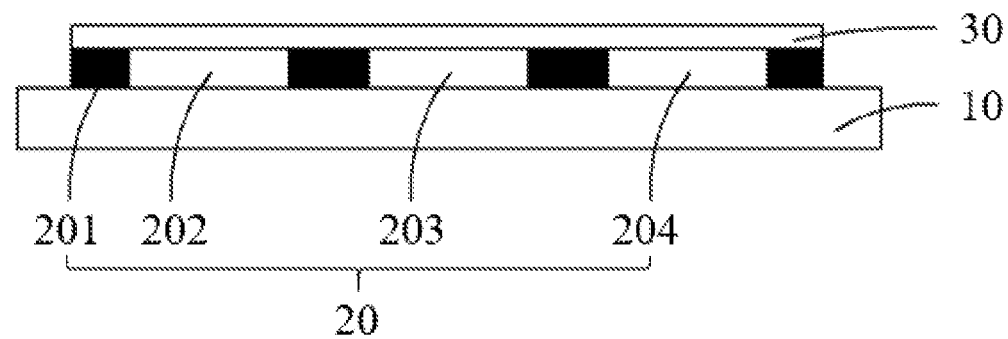

S40: forming a buffer layer 30 on the color filter layer 20, which forms a structure shown in FIG. 2B. The buffer layer 30 is usually a single layer of a silicon nitride film or a silicon oxide film, or a laminated film layer of the silicon nitride film and the silicon oxide film, which is used to protect the color filter layer 20 from contact and reaction with an upper film layer.

S50: forming a plurality of second black matrices 401 corresponding to the plurality of first black matrices 201 on the buffer layer 30, used to prevent light color crosstalk between different pixels. There are gaps between the second black matrices 401, that is, a pixel area for forming a quantum dot film.

Figure 2C:
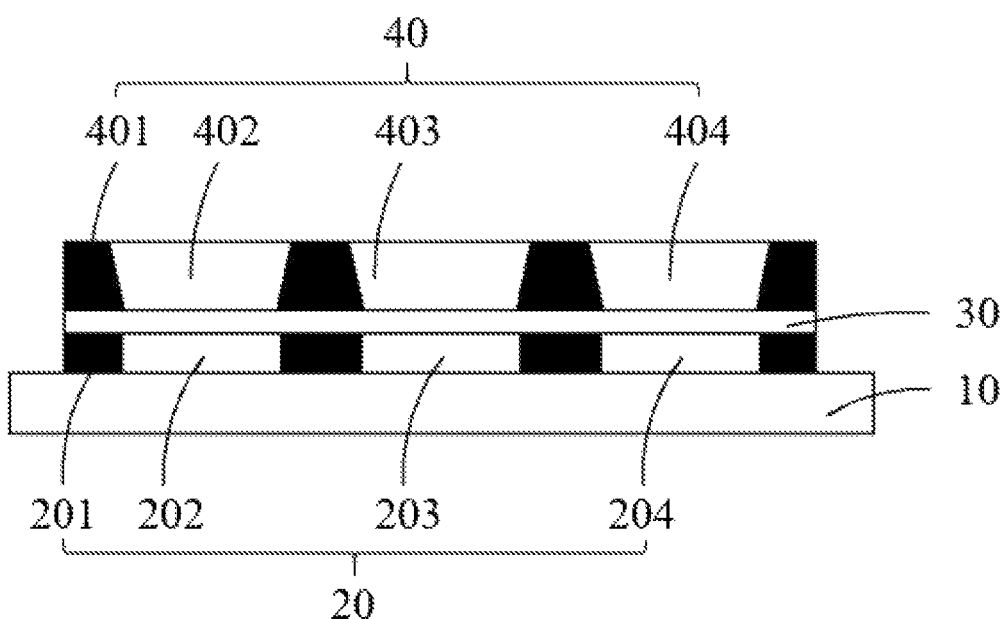

S60: in gaps of the plurality of second black matrices 401, successively dripping the red quantum dot ink on a corresponding region of the plurality of red color resists 202, dripping the green quantum dot ink on a corresponding region of the plurality of green color resists 203, dripping the blank ink on a corresponding region of the plurality of blue color resists 204, and heating to remove the polar solvent to form a quantum dot color conversion layer 40 including a red light color conversion film 402, a green light color conversion film 403, and a transparent film 404, forming a structure as shown in FIG. 2C.

In the color film formed by the manufacturing method in the above embodiment, the quantum dots and the scattering particles are uniformly dispersed in the film layer. Because of van der Waals forces between particles, quantum dot material can also be partially adsorbed on scattering particles. When a blue backlight irradiates the scattering particles, a refraction phenomenon occurs, thereby increasing an optical path of the backlight in the quantum dot film. Because of the increase of the optical path, an amount of the backlight absorbed by the quantum dot material will also increase, and finally a brightness conversion rate of the color film will be improved.

In addition, in the formed color film, a color filter layer is added. On one hand, the blue backlight that is not absorbed by the quantum dots in the green/red pixels can be filtered out to improve color gamut of color rendering. On another hand, it can also filter ambient light to reduce excitation of quantum dots from ambient light to improve contrast.

Further, in the step S10, the scattering particles are selected from at least one of silicon dioxide and titanium dioxide, the polar solvent is selected from at least one of N,N-dimethylformamide, N,N-dimethylacetamide, tetramethylurea, dimethyl sulfoxide, trimethyl phosphate, and N-methylpyrrolidone, and the host material is a transparent polymer material.

Further, in the step S20, in the red quantum dot ink, a content of the red quantum dots ranges between 20 wt % and 30 wt %, and in the green quantum dot ink, a content of the green quantum dots ranges between 20 wt % and 30 wt %.

Further, in the step S60, a dropping process of the red quantum dot ink, the green quantum dot ink, and the blank ink is an inkjet printing process. Because the scattering particles are stably dispersed by the polar solvent, risk of clogging of print nozzles due to the unstable quantum dot ink is greatly reduced.

Another embodiment of the present invention also provides a display panel. The display panel comprises the followings:

An array driving layer, usually includes a plurality of thin film transistors arranged in an array, which are used as individual pixel switches of the display panel.

A blue light emitting layer is used as a blue backlight based on the principle of electroluminescence, and usually can be a blue OLED light emitting layer, a blue mini LED light emitting layer, or a blue micro LED light emitting layer.

The full-color film formed by the above manufacturing method of the full-color film realizes full-color display through photoluminescence.

The color filter layer is on the quantum dot color conversion layer along a light emitting direction of the display panel. That is, a blue backlight emitted by a blue light emitting layer first penetrates the quantum dot color conversion layer, and then penetrates the color filter layer before being emitted.

In the above-mentioned embodiments, the description of each embodiment has its own emphasis. For a part that is not described in detail in an embodiment, refer to the detailed description of other embodiments above, which will not be repeated here.

The manufacturing method of a quantum dot ink, a full-color film, and a display panel provided by the embodiments of the present invention have been described in detail above. Specific examples are used in this article to illustrate the principle and implementation of the present invention. The description of the above embodiments is only used to help understand the method and core idea of the present invention. In addition, for those skilled in the art, according to the idea of the present invention, there will be changes in the specific implementation and the scope of the present application. In summary, the content of this specification should not be construed as limiting the present invention.

What is claimed is:

1. A quantum dot ink, comprising:
quantum dots, scattering particles, a polar solvent, and a transparent polymer material as a host material;
wherein in the quantum dot ink, a content of the quantum dots ranges between 20 weight percent (wt %) and 30 wt % based on a total weight of the quantum dot ink, a content of the scattering particles ranges between 1 wt % and 10 wt % based on the total weight of the quantum dot ink, a content of the polar solvent ranges between 20 wt % and 30 wt % based on the total weight of the quantum dot ink, and a remainder is the transparent polymer material based on the total weight of the quantum dot ink; wherein the quantum dots and the scattering particles are uniformly dispersed in the quantum dot ink, and the quantum dots are partially adsorbed on the scattering particles;
wherein the transparent polymer material is a transparent polymer that is soluble in the polar solvent.

2. The quantum dot ink according to claim 1, wherein the scattering particles are selected from at least one of silicon dioxide and titanium dioxide.

3. The quantum dot ink according to claim 1, wherein the polar solvent is selected from at least one of N,N-dimethylformamide, N,N-dimethylacetamide, tetramethylurea, dimethyl sulfoxide, trimethyl phosphate, and N-methylpyrrolidone.

4. The quantum dot ink according to claim 1, wherein the transparent polymer material comprises polyvinylidene fluoride.

5. The quantum dot ink according to claim 1, wherein the quantum dots are selected from one of blue light quantum dots, red light quantum dots, and green light quantum dots.

* * * * *

UNITED STATES PATENT AND TRADEMARK OFFICE
CERTIFICATE OF CORRECTION

PATENT NO. : 11,659,754 B2
APPLICATION NO. : 16/970366
DATED : May 23, 2023
INVENTOR(S) : Wenxiang Peng Page 1 of 1

It is certified that error appears in the above-identified patent and that said Letters Patent is hereby corrected as shown below:

On the Title Page

Item (73) should be corrected as follows:
(73) Assignee: SHENZHEN CHINA STAR
OPTOELECTRONICS
SEMICONDUCTOR DISPLAY
TECHNOLOGY CO., LTD.,
Shenzhen (CN)

Signed and Sealed this
Twenty-third Day of July, 2024

Katherine Kelly Vidal
*Director of the United States Patent and Trademark Office*